(12) United States Patent
Gejo et al.

(10) Patent No.: US 11,784,246 B2
(45) Date of Patent: Oct. 10, 2023

(54) SEMICONDUCTOR DEVICE AND SEMICONDUCTOR MODULE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Ryohei Gejo, Kawasaki (JP); Tatsunori Sakano, Shinagawa (JP); Takahiro Kato, Yokohama (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 225 days.

(21) Appl. No.: 17/411,275

(22) Filed: Aug. 25, 2021

(65) Prior Publication Data
US 2022/0140120 A1 May 5, 2022

(30) Foreign Application Priority Data

Nov. 2, 2020 (JP) .................................. 2020-183559

(51) Int. Cl.
*H01L 29/06* (2006.01)
*H01L 29/739* (2006.01)

(52) U.S. Cl.
CPC ...... *H01L 29/7397* (2013.01); *H01L 29/0607* (2013.01)

(58) Field of Classification Search
CPC combination set(s) only.
See application file for complete search history.

(56) References Cited

U.S. PATENT DOCUMENTS 6,323,509 B1 11/2001 Kusunoki
2015/0162429 A1 6/2015 Hashimoto et al.
(Continued)

FOREIGN PATENT DOCUMENTS

JP 2011-77187 A 4/2011
JP 4980743 B2 7/2012
(Continued)

OTHER PUBLICATIONS

Harada, S. et al. "Optimal double sided gate control of IGBT for lower turn-off loss and surge voltage suppression" 9th International Conference on Integrated Power Electronics Systems (2016), 5 pages.

*Primary Examiner* — Moin M Rahman
(74) *Attorney, Agent, or Firm* — Oblon, McClelland, Maier & Neustadt, L.L.P.

(57) ABSTRACT

According to one embodiment, a semiconductor device includes first to fourth electrodes, a semiconductor member, and first and second insulating members. The semiconductor member is located between the second and first electrodes, and includes a first semiconductor region a second semiconductor region between the first semiconductor region and the first electrode, a third semiconductor region between the second semiconductor region and the first electrode, a fourth semiconductor region between the second semiconductor region and the first electrode, a fifth semiconductor region between the first semiconductor region and the second electrode, a sixth semiconductor region between the fifth semiconductor region and the second electrode, and a seventh semiconductor region between the fifth semiconductor region and the second electrode. A portion of the first insulating member is between the third electrode and the semiconductor member. A portion of the second insulating (Continued)

member is between the fourth electrode and the semiconductor member.

20 Claims, 15 Drawing Sheets

(56) References Cited

U.S. PATENT DOCUMENTS

| | | |
|---|---|---|
| 2018/0083129 A1 | 3/2018 | Kitagawa |
| 2019/0311917 A1 | 10/2019 | Mori et al. |
| 2020/0091323 A1 | 3/2020 | Iwakaji et al. |
| 2020/0098903 A1 | 3/2020 | Satoh |
| 2021/0384298 A1* | 12/2021 | Hoshi ................ H01L 29/7815 |

FOREIGN PATENT DOCUMENTS

| | | |
|---|---|---|
| JP | WO 2017/099122 A1 | 6/2017 |
| JP | 2018-182216 A | 11/2018 |

* cited by examiner

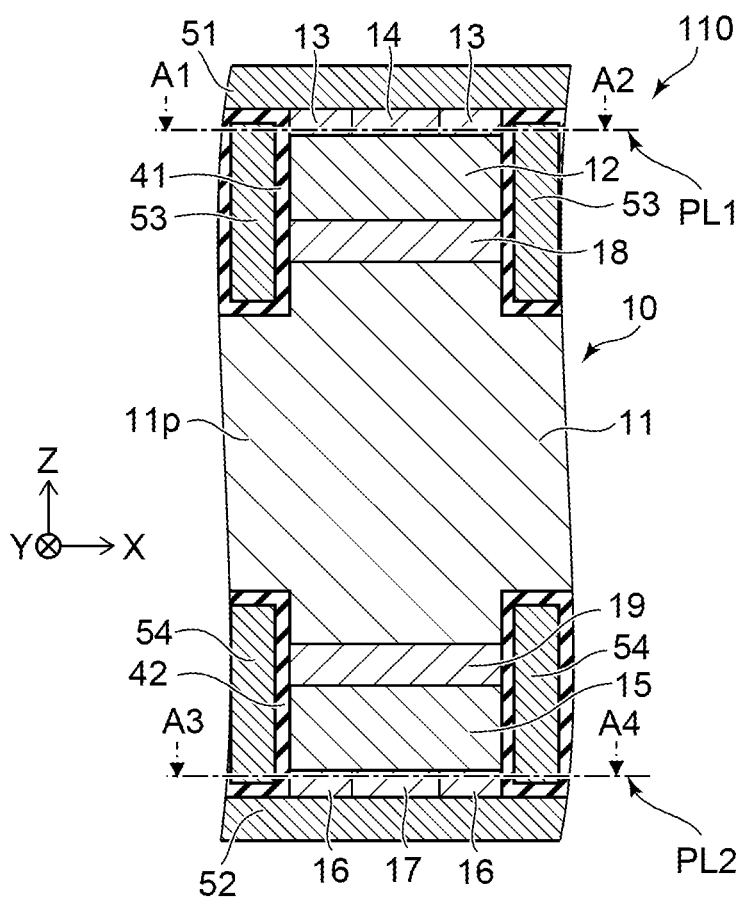
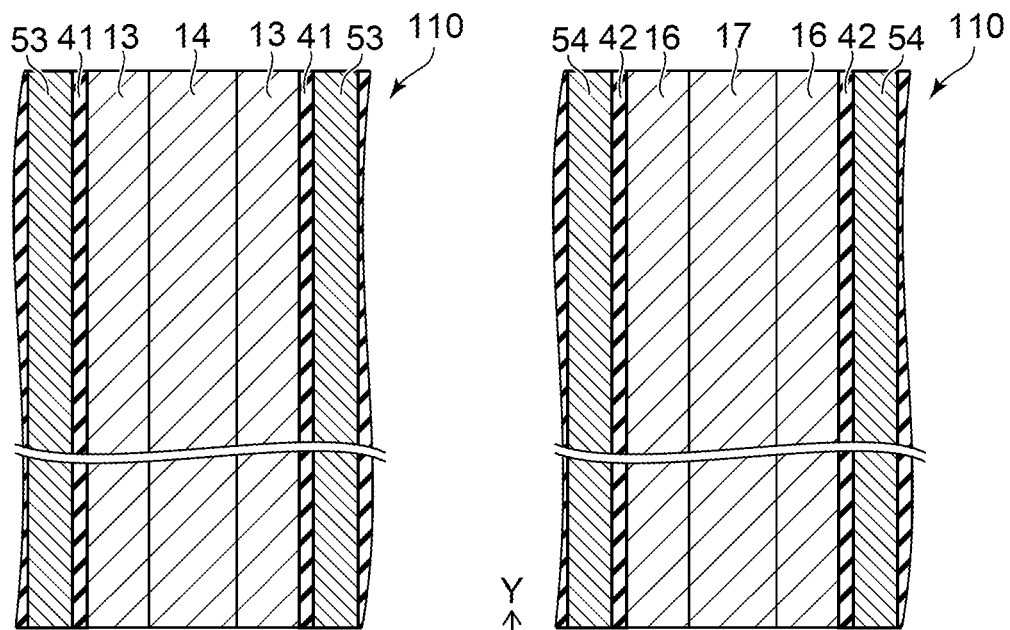
FIG. 1A
FIG. 1B  FIG. 1C

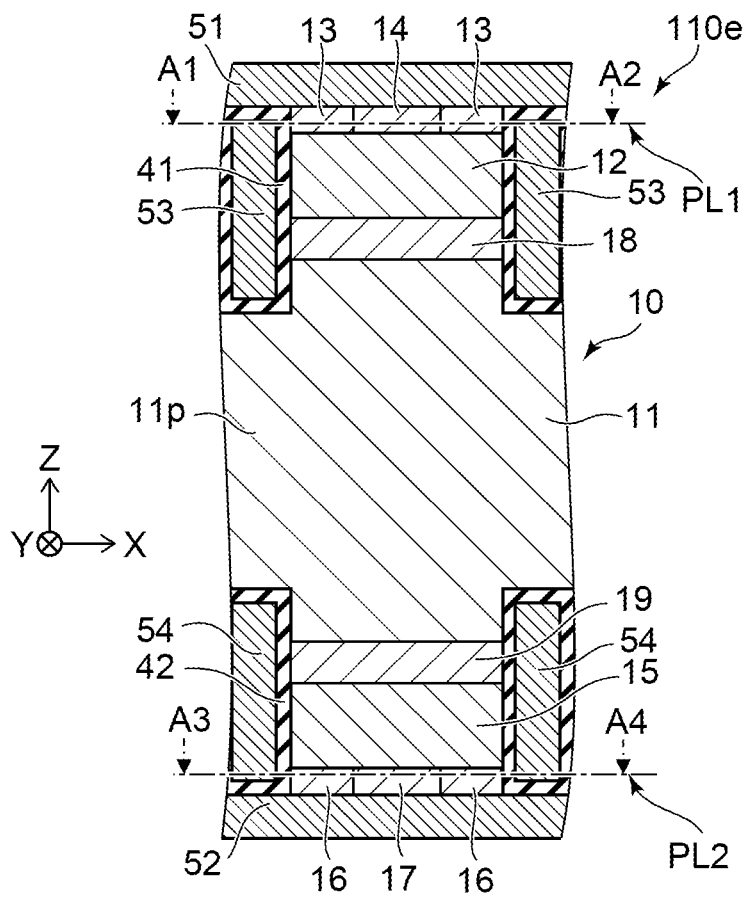
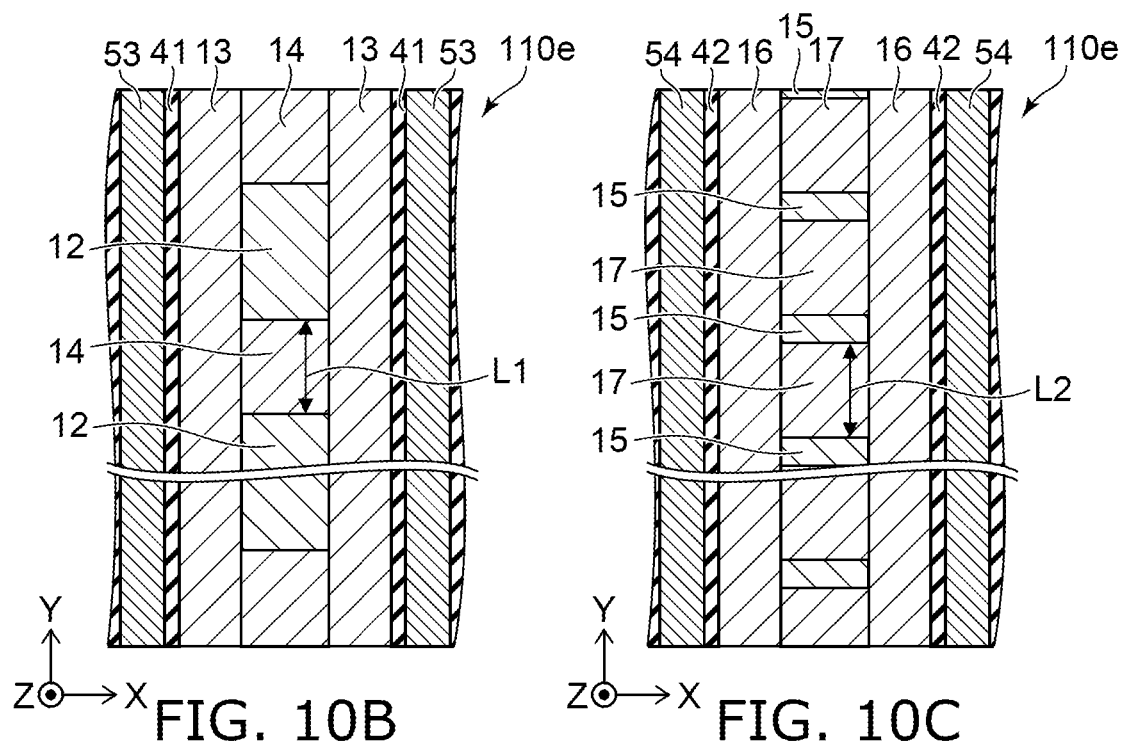
FIG. 10A
FIG. 10B
FIG. 10C

SEMICONDUCTOR DEVICE AND SEMICONDUCTOR MODULE

CROSS-REFERENCE TO RELATED APPLICATIONS

This application is based upon and claims the benefit of priority from Japanese Patent Application No. 2020-183559, filed on Nov. 2, 2020; the entire contents of which are incorporated herein by reference.

FIELD

Embodiments described herein relate generally to a semiconductor device and a semiconductor module.

BACKGROUND

For example, it is desirable to reduce the loss in a semiconductor device such as a transistor or the like.

BRIEF DESCRIPTION OF THE DRAWINGS

FIGS. 1A to 1C are schematic cross-sectional views illustrating a semiconductor device according to a first embodiment;

FIGS. 10A to 10C are schematic cross-sectional views illustrating a semiconductor device according to the first embodiment;

DETAILED DESCRIPTION

Figure 2A:
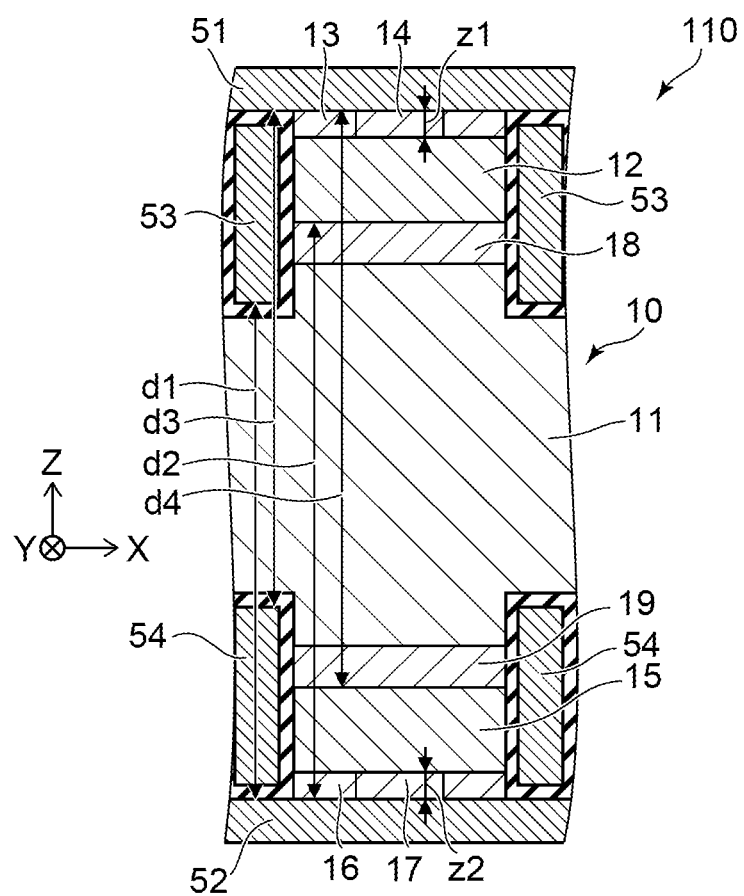
FIGS. 2A to 2C are schematic cross-sectional views illustrating the semiconductor device according to the first embodiment.

According to one embodiment, a semiconductor device includes a first electrode, a second electrode, a third electrode, a fourth electrode, a semiconductor member, a first insulating member, and a second insulating member. A direction from the second electrode toward the first electrode is along a first direction. The semiconductor member is located between the second electrode and the first electrode in the first direction. The semiconductor member includes a first semiconductor region of a first conductivity type, a second semiconductor region located between the first semiconductor region and the first electrode, the second semiconductor region being of a second conductivity type, a third semiconductor region located between the second semiconductor region and the first electrode, the third semiconductor region being of the first conductivity type, a fourth semiconductor region located between the second semiconductor region and the first electrode, the fourth semiconductor region being of the second conductivity type, a fifth semiconductor region located between the first semiconductor region and the second electrode, the fifth semiconductor region being of the second conductivity type, a sixth semiconductor region located between the fifth semiconductor region and the second electrode, the sixth semiconductor region being of the first conductivity type, and a seventh semiconductor region located between the fifth semiconductor region and the second electrode, the seventh semiconductor region being of the second conductivity type. The fourth semiconductor region includes a first impurity concentration of the second conductivity type, a first carrier concentration of the second conductivity type, and a first volume ratio of a volume of the fourth semiconductor region to a volume of the semiconductor member. The seventh semiconductor region includes at least one of a second impurity concentration that is of the second conductivity type and is greater than the first impurity concentration, a second carrier concentration that is of the second conductivity type and is greater than the first carrier concentration, or a second volume ratio that is greater than the first volume ratio. The second volume ratio is a volume ratio of the seventh semiconductor region to the volume of the semiconductor member. A second direction from a portion of the third electrode toward the second semiconductor region crosses the first direction. At least a portion of the third semiconductor region is in at least one of a first position or a second position. The first position is between the fourth semiconductor region and a portion of the third electrode in the second direction. The second position is between the portion of the third electrode and a portion of the second semiconductor region in the second direction. A third direction from a portion of the fourth electrode toward the fifth semiconductor region crosses the first direction. At least a portion of the sixth semiconductor region is in at least one of a third position or a fourth position. The third position is between the seventh semiconductor region and a portion of the fourth electrode in the third direction. The fourth position is between the portion of the fourth electrode and a portion of the fifth semiconductor region in the third direction. At least a portion of the first insulating member is between the third electrode and the semiconductor member. At least a portion of the second insulating member is between the fourth electrode and the semiconductor member.

According to one embodiment, a semiconductor module includes the semiconductor device described above, and a controller electrically connected with the third and fourth electrodes. In a first operation of switching the third electrode from a first potential to a second potential, the controller switches the fourth electrode from a third potential to a fourth potential at a second time before a first time of switching the third electrode from the first potential to the second potential. The second potential is less than the first potential. The fourth potential is greater than the third potential.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIGS. 1A to 1C and FIGS. 2A to 2C are schematic cross-sectional views illustrating a semiconductor device according to a first embodiment.

FIG. 1B is a line A1-A2 cross-sectional view of FIG. 1A.
FIG. 1C is a line A3-A4 cross-sectional view of FIG. 1A.
FIG. 2B is a line A1-A2 cross-sectional view of FIG. 2A.
FIG. 2C is a line A3-A4 cross-sectional view of FIG. 2A.

As shown in FIG. 1A, the semiconductor device 110 according to the embodiment includes a first electrode 51, a second electrode 52, a third electrode 53, a fourth electrode 54, a semiconductor member 10, a first insulating member 41, and a second insulating member 42.

The direction from the second electrode 52 toward the first electrode 51 is along a first direction. The first direction is taken as a Z-axis direction. One direction perpendicular to the first direction is taken as an X-axis direction. A direction perpendicular to the Z-axis direction and the X-axis direction is taken as a Y-axis direction.

The semiconductor member 10 is located between the second electrode 52 and the first electrode 51 in the first direction (the Z-axis direction). The semiconductor member 10 includes a first semiconductor region 11 of a first conductivity type, a second semiconductor region 12 of a second conductivity type, a third semiconductor region 13 of the first conductivity type, a fourth semiconductor region 14 of the second conductivity type, a fifth semiconductor region 15 of the second conductivity type, a sixth semiconductor region 16 of the first conductivity type, and a seventh semiconductor region 17 of the second conductivity type.

For example, the first conductivity type is an n-type; and the second conductivity type is a p-type. According to the embodiment, the first conductivity type may be the p-type; and the second conductivity type may be the n-type. In the following examples, the first conductivity type is the n-type; and the second conductivity type is the p-type.

The first semiconductor region 11 is between the second electrode 52 and the first electrode 51. The second semiconductor region 12 is located between the first semiconductor region 11 and the first electrode 51. The third semiconductor region 13 is located between the second semiconductor region 12 and the first electrode 51. The fourth semiconductor region 14 is located between the second semiconductor region 12 and the first electrode 51. In the example, the direction from the third semiconductor region 13 toward the fourth semiconductor region 14 crosses the Z-axis direction. For example, the direction from the third semiconductor region 13 toward the fourth semiconductor region 14 is along the X-axis direction.

The fifth semiconductor region 15 is located between the first semiconductor region 11 and the second electrode 52. The sixth semiconductor region 16 is located between the fifth semiconductor region 15 and the second electrode 52. The seventh semiconductor region 17 is located between the fifth semiconductor region 15 and the second electrode 52. In the example, the direction from the sixth semiconductor region 16 toward the seventh semiconductor region 17 crosses the Z-axis direction. For example, the direction from the sixth semiconductor region 16 toward the seventh semiconductor region 17 is along the X-axis direction.

In the example, the semiconductor member 10 includes an eighth semiconductor region 18 and a ninth semiconductor region 19. The eighth semiconductor region 18 is located between the first semiconductor region 11 and the second semiconductor region 12. The eighth semiconductor region 18 is of the first conductivity type. The ninth semiconductor region 19 is located between the first semiconductor region 11 and the fifth semiconductor region 15. The ninth semiconductor region 19 is of the first conductivity type.

A second direction from a portion of the third electrode 53 toward the second semiconductor region 12 crosses the first direction. The second direction is, for example, the X-axis direction. In the example, at least a portion of the third semiconductor region 13 is between the fourth semiconductor region 14 and a portion of the third electrode 53 in the second direction (e.g., the X-axis direction).

A third direction from a portion of the fourth electrode 54 toward the fifth semiconductor region 15 crosses the first direction. In the example, the third direction is along the X-axis direction. The direction from the fourth electrode 54 toward the fifth semiconductor region 15 is along, for example, the third direction (e.g., the X-axis direction). In the example, at least a portion of the sixth semiconductor region 16 is between the seventh semiconductor region 17 and a portion of the fourth electrode 54 in the third direction (e.g., the X-axis direction). In the example, the third direction is along the second direction.

The position in the first direction (the Z-axis direction) of a portion 11p of the first semiconductor region 11 is between the position in the first direction of the fourth electrode 54 and the position in the first direction of the third electrode 53. In the example, the third electrode 53 and the fourth electrode 54 are between the second electrode 52 and the first electrode 51. In the example, the portion 11p of the first semiconductor region 11 is between the fourth electrode 54 and the third electrode 53 in the first direction (the Z-axis direction).

At least a portion of the first insulating member 41 is between the third electrode 53 and the semiconductor member 10. A portion of the first insulating member 41 may be located between the third electrode 53 and the first electrode 51.

At least a portion of the second insulating member 42 is between the fourth electrode 54 and the semiconductor member 10. A portion of the second insulating member 42 may be located between the fourth electrode 54 and the second electrode 52.

In the semiconductor device 110, the following first and second operations can be performed. In the first operation, the current that flows between the first electrode 51 and the second electrode 52 can be controlled by the potential of the third electrode 53. The potential of the third electrode 53 is, for example, a potential that is referenced to the potential of the first electrode 51. In the first operation, the current flows in the orientation from the second electrode 52 toward the first electrode 51. In the second operation, the current is caused to flow in the orientation from the first electrode 51 toward the second electrode 52 by setting the fourth electrode 54 to a high potential. The semiconductor device 110 is, for example, an RC-IGBT (Reverse-Conducting Insulated Gate Bipolar Transistor). For example, the first operation corresponds to an IGBT operation. For example, the second operation corresponds to a diode operation. The first electrode 51 is, for example, an emitter electrode. The second electrode 52 is, for example, a collector electrode. The third electrode 53 is, for example, a gate electrode. The fourth electrode 54 is, for example, a control electrode. The first operation and the second operation may be repeatedly performed.

Figures 2B, 2C:
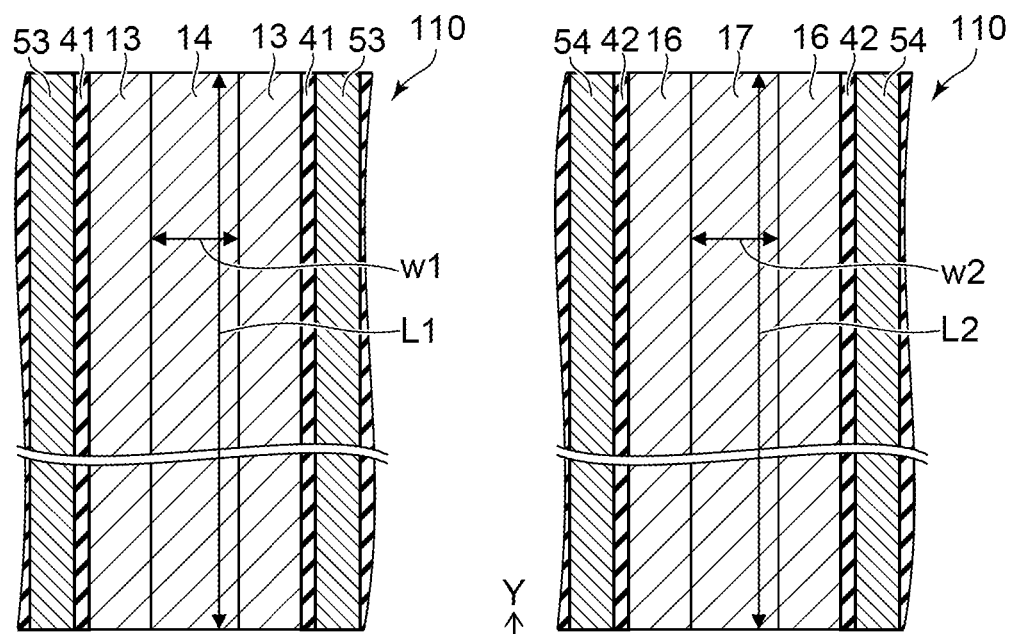

As shown in FIG. 2A, the distance along the first direction (the Z-axis direction) between the second electrode 52 and the third electrode 53 is taken as a first distance d1. The distance along the first direction between the second electrode 52 and the second semiconductor region 12 is taken as a second distance d2. The first distance d1 is less than the second distance d2.

As shown in FIG. 2A, the distance along the first direction (the Z-axis direction) between the first electrode 51 and the fourth electrode 54 is taken as a third distance d3. The distance along the first direction between the first electrode 51 and the fifth semiconductor region 15 is taken as a fourth distance d4. The third distance d3 is less than the fourth distance.

For example, the lower end of the third electrode 53 is lower than the upper end of the first semiconductor region 11. For example, the upper end of the fourth electrode 54 is higher than the lower end of the first semiconductor region 11.

In the example, the direction from the third semiconductor region 13 toward the fourth semiconductor region 14 crosses the first direction (the Z-axis direction). For example, the direction from the third semiconductor region 13 toward the fourth semiconductor region 14 is along the second direction (e.g., the X-axis direction). The direction from the sixth semiconductor region 16 toward the seventh semiconductor region 17 crosses the first direction (the Z-axis direction). For example, the direction from the sixth semiconductor region 16 toward the seventh semiconductor region 17 is along the second direction (e.g., the X-axis direction).

In the example, at least a portion of the third semiconductor region 13 is between the fourth semiconductor region 14 and a portion of the third electrode 53. At least a portion of the sixth semiconductor region 16 is between the seventh semiconductor region 17 and a portion of the fourth electrode 54.

The third semiconductor region 13 and the fourth semiconductor region 14 are electrically connected with the first electrode 51. The sixth semiconductor region 16 and the seventh semiconductor region 17 are electrically connected with the second electrode 52.

For example, the second-conductivity-type carrier concentration (e.g., a first carrier concentration) in the fourth semiconductor region 14 is greater than the second-conductivity-type carrier concentration in the second semiconductor region 12. The electrical resistance of the connection with the first electrode 51 is reduced thereby. For example, a collector-emitter saturation voltage VCE (sat) can be reduced.

For example, the second-conductivity-type carrier concentration (e.g., a second carrier concentration) in the seventh semiconductor region 17 is greater than the second-conductivity-type carrier concentration in the fifth semiconductor region 15. The electrical resistance of the connection with the second electrode 52 is reduced thereby. For example, the collector-emitter saturation voltage VCE (sat) can be reduced.

For example, the first-conductivity-type carrier concentration in the third semiconductor region 13 is greater than the first-conductivity-type carrier concentration in the first semiconductor region 11. The electrical resistance of the connection with the first electrode 51 is reduced thereby. For example, the collector-emitter saturation voltage VCE (sat) can be reduced.

For example, the first-conductivity-type carrier concentration in the sixth semiconductor region 16 is greater than the first-conductivity-type carrier concentration in the first semiconductor region 11. The electrical resistance of the connection with the second electrode 52 is reduced thereby. For example, the collector-emitter saturation voltage VCE (sat) can be reduced.

For example, the first-conductivity-type impurity concentration in the eighth semiconductor region 18 is greater than the first-conductivity-type impurity concentration in the first semiconductor region. For example, the first-conductivity-type impurity concentration in the ninth semiconductor region 19 is greater than the first-conductivity-type impurity concentration in the first semiconductor region 11.

For example, the first semiconductor region 11 is an n⁻-region or an n-region. The third semiconductor region 13 and the sixth semiconductor region 16 are, for example, n⁺⁺-regions. The eighth semiconductor region 18 and the ninth semiconductor region 19 are, for example, n⁺-regions.

For example, the second semiconductor region 12 and the fifth semiconductor region 15 are p-regions. For example, the fourth semiconductor region 14 may be a p⁺-region, etc. The seventh semiconductor region 17 may be, for example, a p⁺⁺-region, etc.

In one example of the embodiment, the second-conductivity-type carrier concentration in the fourth semiconductor region 14 is different from the second-conductivity-type carrier concentration in the seventh semiconductor region 17. According to the embodiment as described below, at least one of the conduction characteristic or the configuration is different between the fourth semiconductor region 14 and the seventh semiconductor region 17.

For example, the fourth semiconductor region 14 has the first impurity concentration of the second conductivity type. The fourth semiconductor region 14 has the first carrier concentration of the second conductivity type. The fourth semiconductor region 14 has a first thickness z1 along the first direction (referring to FIG. 2A). The fourth semiconductor region 14 has a first area ratio. The first area ratio is the ratio of the surface area of the fourth semiconductor region 14 per unit area in a first plane PL1 crossing the first direction (referring to FIG. 1A). For example, the first plane PL1 passes through the fourth semiconductor region 14 along the X-Y plane. The fourth semiconductor region 14 has a first volume ratio. The first volume ratio is the ratio of the volume of the fourth semiconductor region 14 to the volume of the semiconductor member 10.

For example, the seventh semiconductor region 17 has the second impurity concentration of the second conductivity type. The seventh semiconductor region 17 has the second carrier concentration of the second conductivity type. The seventh semiconductor region 17 has a second thickness z2 along the first direction (referring to FIG. 2A). The seventh semiconductor region 17 has a second area ratio. The second area ratio is the ratio of the surface area of the seventh semiconductor region 17 per unit area in a second plane PL2 crossing the first direction (referring to FIG. 2A). For example, the second plane PL2 passes through the seventh semiconductor region 17 along the X-Y plane. The seventh semiconductor region 17 has a second volume ratio. The second volume ratio is the ratio of the volume of the seventh semiconductor region 17 to the volume of the semiconductor member 10.

For example, the second impurity concentration is greater than the first impurity concentration. For example, the second carrier concentration is greater than the first carrier concentration. For example, the second thickness z2 is greater than the first thickness z1. For example, the second area ratio is greater than the first area ratio. For example, the second volume ratio is greater than the first volume ratio.

As described below, a turn-off switching loss Eoff can be reduced thereby. For example, the collector-emitter saturation voltage VCE (sat) can be reduced. By setting the second-conductivity-type carrier concentration in the fourth semiconductor region 14 to be low, for example, a reverse recovery operation switching loss Err can be reduced.

An example of characteristics of the semiconductor device will now be described. A relationship between characteristics in the off-state of the IGBT operation and the carrier concentration difference between the fourth semiconductor region 14 and the seventh semiconductor region 17 will now be described.

Figure 3:
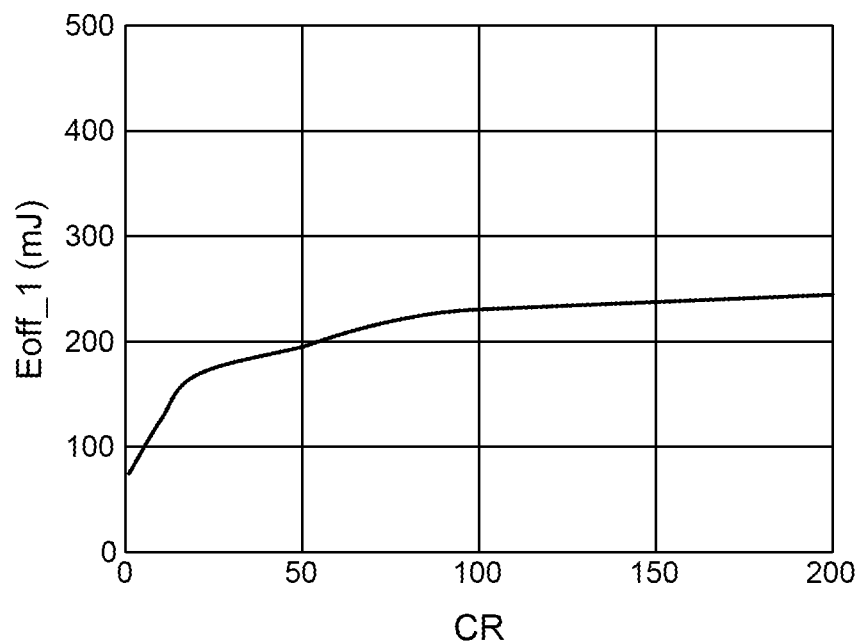
FIG. 3 is a graph illustrating a characteristic of the semiconductor device.

FIG. 3 is a graph illustrating a characteristic of the semiconductor device.

The horizontal axis of FIG. 3 is a ratio CR of the carrier concentrations. The ratio CR is the ratio of the second-conductivity-type carrier concentration (a second carrier concentration C2) in the seventh semiconductor region 17 to the second-conductivity-type carrier concentration (a first carrier concentration C1) in the fourth semiconductor region 14. The ratio CR is C2/C1. The vertical axis of FIG. 3 is a reduction amount Eoff_1 of the turn-off switching loss Eoff. The reduction amount Eoff_1 of the turn-off switching loss Eoff is the reduction amount referenced to the turn-off switching loss Eoff for a configuration that does not include the fourth electrode 54. A large reduction amount Eoff_1 of the turn-off switching loss Eoff corresponds to a small turn-off switching loss Eoff. In FIG. 3, the potential of the fourth electrode 54 is set to the on-state at the time at which the potential of the third electrode 53 is set to the off-state.

As shown in FIG. 3, the reduction amount Eoff_1 of the turn-off switching loss Eoff increases as the ratio CR increases. From FIG. 3, it can be seen that the turn-off switching loss Eoff can be reduced by increasing the ratio CR. It is considered that more carriers are stored in the on-state when the ratio CR is high. Accordingly, when the ratio CR is high, the total carrier amount that is ejectable by switching the fourth electrode 54 on is high. It is considered that the turn-off switching loss Eoff is reduced thereby.

Figure 4:
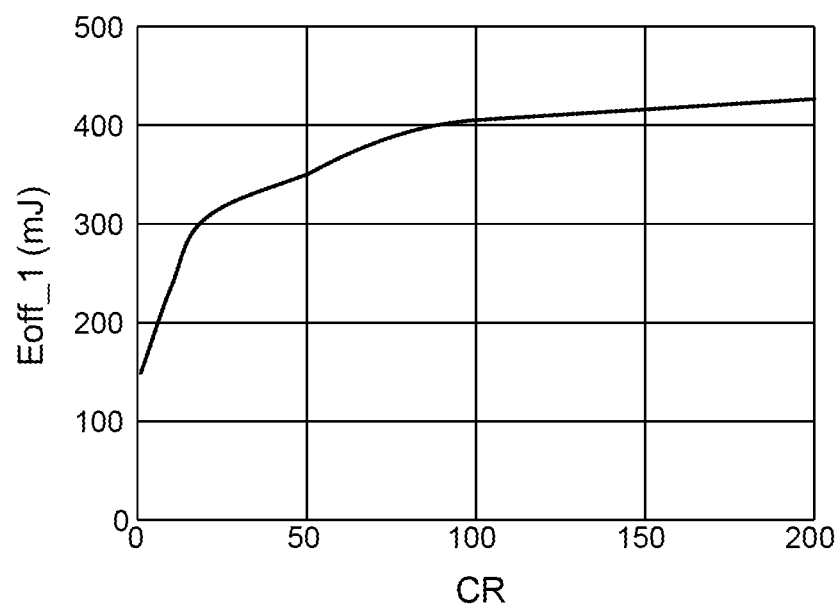
FIG. 4 is a graph illustrating a characteristic of the semiconductor device.

FIG. 4 is a graph illustrating a characteristic of the semiconductor device.

In FIG. 4, the potential of the fourth electrode 54 is set to the on-state before the time at which the potential of the third electrode 53 is set to the off-state. In the example of FIG. 4, the difference between the time at which the potential of the fourth electrode 54 is set to the on-state and the time at which the potential of the third electrode 53 is set to the off-state is 60 ρS. The horizontal axis of FIG. 4 is the ratio CR. The vertical axis of FIG. 4 is the reduction amount Eoff_1 of the turn-off switching loss Eoff. In the example shown in FIG. 4 as well, the reduction amount Eoff_1 of the turn-off switching loss Eoff increases as the ratio CR increases.

Figure 5:
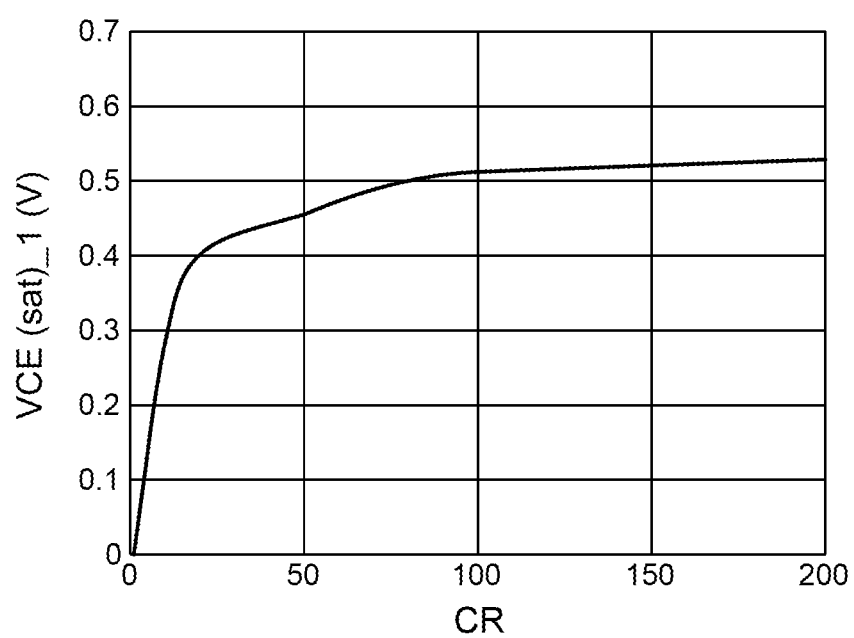
FIG. 5 is a graph illustrating a characteristic of the semiconductor device.

FIG. 5 is a graph illustrating a characteristic of the semiconductor device.

The horizontal axis of FIG. 5 is the ratio CR. The vertical axis of FIG. 5 is a reduction amount VCE (sat)_1 of the collector-emitter saturation voltage VCE (sat). The reduction amount VCE (sat)_1 of the collector-emitter saturation voltage VCE (sat) is the reduction amount referenced to the collector-emitter saturation voltage VCE (sat) for a configuration that does not include the fourth electrode 54. It can be seen from FIG. 5 that the reduction amount VCE (sat)_1 of the collector-emitter saturation voltage VCE (sat) increases as the ratio CR increases. The collector-emitter saturation voltage VCE (sat) can be reduced by increasing the ratio CR.

From FIGS. 3 to 5, it is favorable for the ratio CR of the second-conductivity-type carrier concentration (the second carrier concentration C2) in the seventh semiconductor region 17 to the second-conductivity-type carrier concentration (the first carrier concentration C1) in the fourth semiconductor region 14 to be not less than 20. For example, the turn-off switching loss Eoff can be reduced thereby. For example, the collector-emitter saturation voltage VCE (sat) can be reduced.

According to the embodiment, for example, the amount of the second-conductivity-type carriers in the seventh semiconductor region 17 is greater than the amount of the second-conductivity-type carriers in the fourth semiconductor region 14. For example, in the IGBT operation, the injection efficiency of holes at the second electrode 52 is high. For example, the injection efficiency of the holes at the second electrode 52 in the IGBT operation is greater than the hole injection efficiency at the first electrode 51 in the diode operation. The reverse recovery operation switching loss Err in the diode operation is easily reduced. On the other hand, for the off-state of the IGBT operation, the turn-off switching loss Eoff can be reduced by the second electrode 52 at which the carrier concentration is high.

According to the embodiment, for example, the turn-off switching loss Eoff can be effectively reduced. For example, the collector-emitter saturation voltage VCE (sat) can be effectively reduced.

Thus, for example, the loss can be reduced by setting the second-conductivity-type carrier concentration (the second carrier concentration) in the seventh semiconductor region 17 to be greater than the second-conductivity-type carrier concentration (the first carrier concentration) in the fourth semiconductor region 14. According to the embodiment, a semiconductor device can be provided in which the loss can be reduced.

According to the embodiment, it is favorable for the second carrier concentration to be not less than 20 times the first carrier concentration. The loss can be effectively reduced thereby. For example, the second carrier concentration may be not more than 2000 times the first carrier concentration.

According to the embodiment, the fourth semiconductor region 14 and the seventh semiconductor region 17 may be formed by introducing a second-conductivity-type impurity into a first-conductivity-type region. In such a case, the carrier concentration difference in these regions may be formed by the concentration difference of the second-conductivity-type impurity.

According to the embodiment, for example, it is favorable for the second impurity concentration to be not less than 20 times the first impurity concentration. The loss can be effectively reduced thereby. For example, the second impurity concentration may be not more than 2000 times the first impurity concentration.

The example of FIG. 3 shows the relationship between the electrical characteristic and the impurity concentration difference between the fourth semiconductor region 14 and the seventh semiconductor region 17. The characteristic illustrated in FIG. 3 is obtained by the volume difference between the fourth semiconductor region 14 and the seventh semiconductor region 17.

For example, the loss can be reduced by setting the second thickness z2 of the seventh semiconductor region 17 to be greater than the first thickness z1 of the fourth semiconductor region 14. The loss can be reduced thereby.

For example, the loss can be reduced by setting the ratio (the second area ratio) of the surface area of the seventh semiconductor region 17 per unit area in the second plane PL2 to be greater than the ratio (the first area ratio) of the surface area of the fourth semiconductor region 14 per unit area in the first plane PL1. According to the embodiment, for example, the second area ratio is not less than 20 times the first area ratio. The loss can be effectively reduced thereby. For example, the second area ratio may be not more than 2000 times the first area ratio.

For example, the loss can be reduced by setting the ratio (the second volume ratio) of the volume of the seventh semiconductor region 17 to the volume of the semiconductor member 10 to be greater than the ratio (the first volume ratio) of the volume of the fourth semiconductor region 14 to the volume of the semiconductor member 10. According to the embodiment, for example, the second volume ratio is not less than 20 times the first volume ratio. The loss can be effectively reduced thereby.

For example, the volume ratio may be modified by modifying the lengths (a first width w1 and a second width w2 referring to FIG. 2C) in the X-axis direction of the fourth and seventh semiconductor regions 14 and 17. The volume ratio may be modified by modifying the lengths (a first length L1 and a second length L2 referring to FIG. 2C) in the Y-axis direction of the fourth and seventh semiconductor regions 14 and 17.

Several examples of the semiconductor device according to the embodiment will now be described. A description is omitted for portions to which configurations similar to those of the semiconductor device 110 are applicable.

Figure 6A:
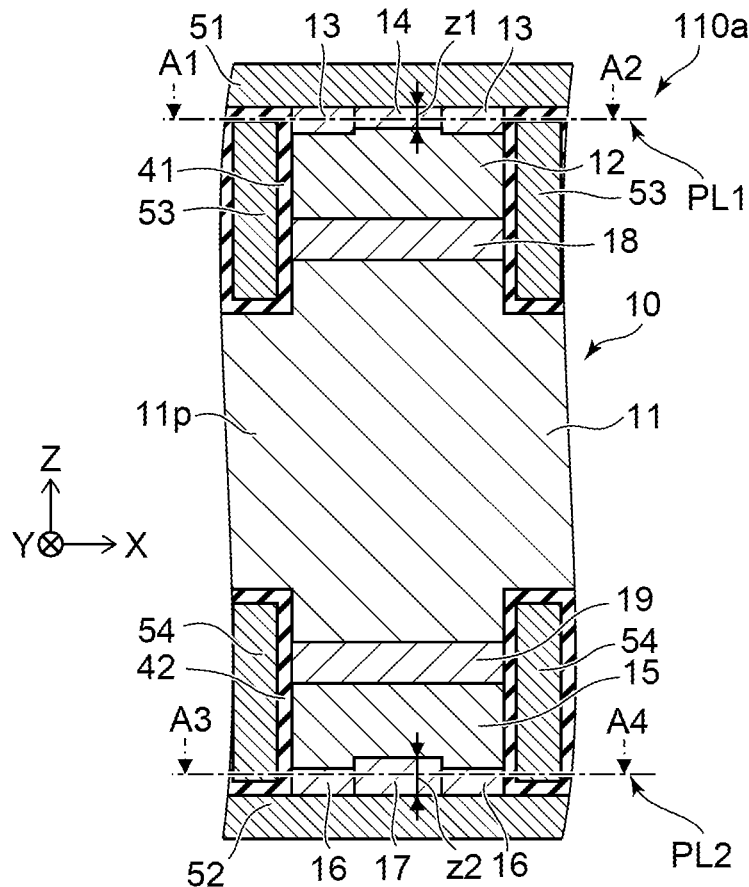
FIGS. 6A to 6C are schematic cross-sectional views illustrating a semiconductor device according to the first embodiment.
Figures 6B, 6C:
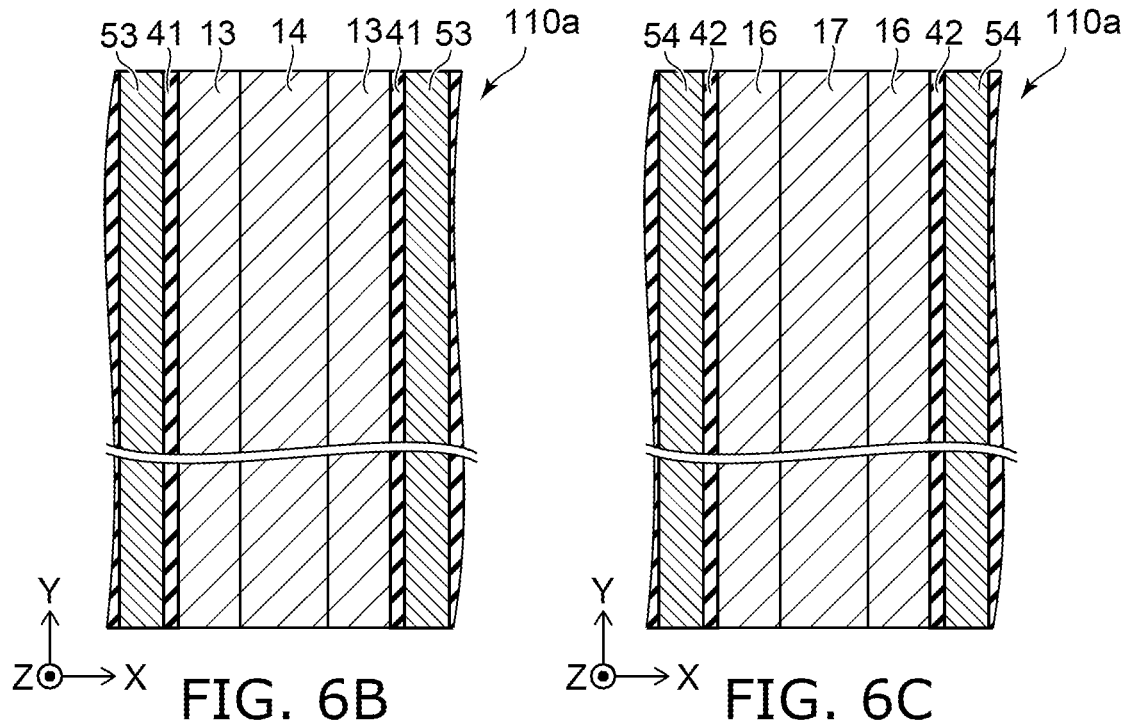

FIGS. 6A to 6C are schematic cross-sectional views illustrating a semiconductor device according to the first embodiment.

FIG. 6B is a line A1-A2 cross-sectional view of FIG. 6A. FIG. 6C is a line A3-A4 cross-sectional view of FIG. 6A.

In the semiconductor device 110a as shown in FIG. 6A, the second thickness z2 of the seventh semiconductor region 17 is greater than the thickness of the first thickness z1 of the fourth semiconductor region 14. According to the embodiment, for example, the second thickness z2 is not less than 20 times the first thickness z1. The loss can be effectively reduced thereby. The second thickness z2 may be not more than 2000 times the first thickness z1.

Figure 7A:
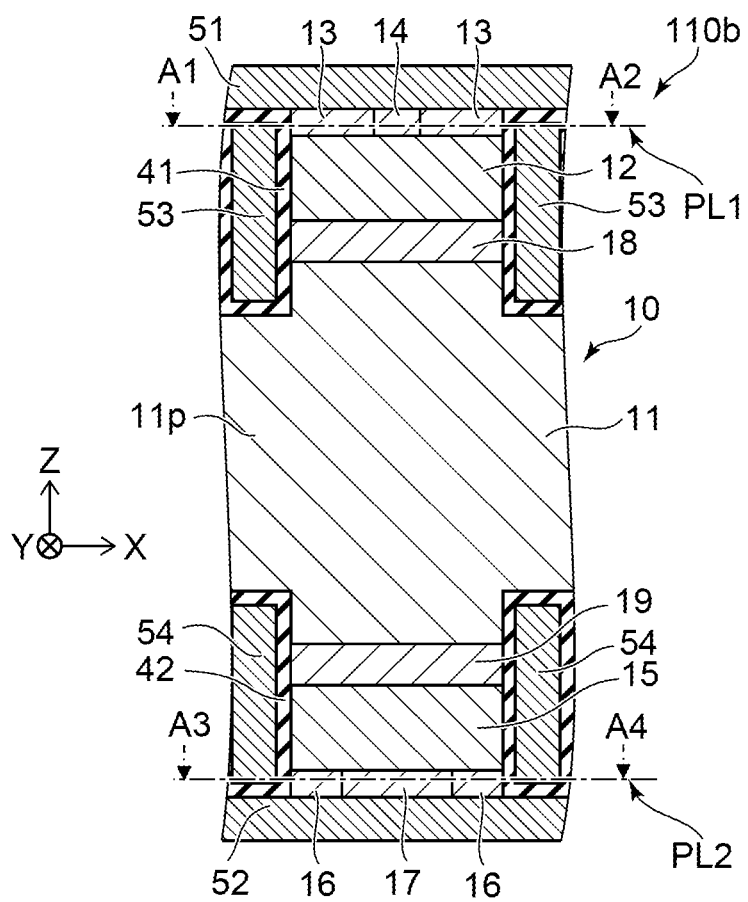
FIGS. 7A to 7C are schematic cross-sectional views illustrating a semiconductor device according to the first embodiment.
Figures 7B, 7C:
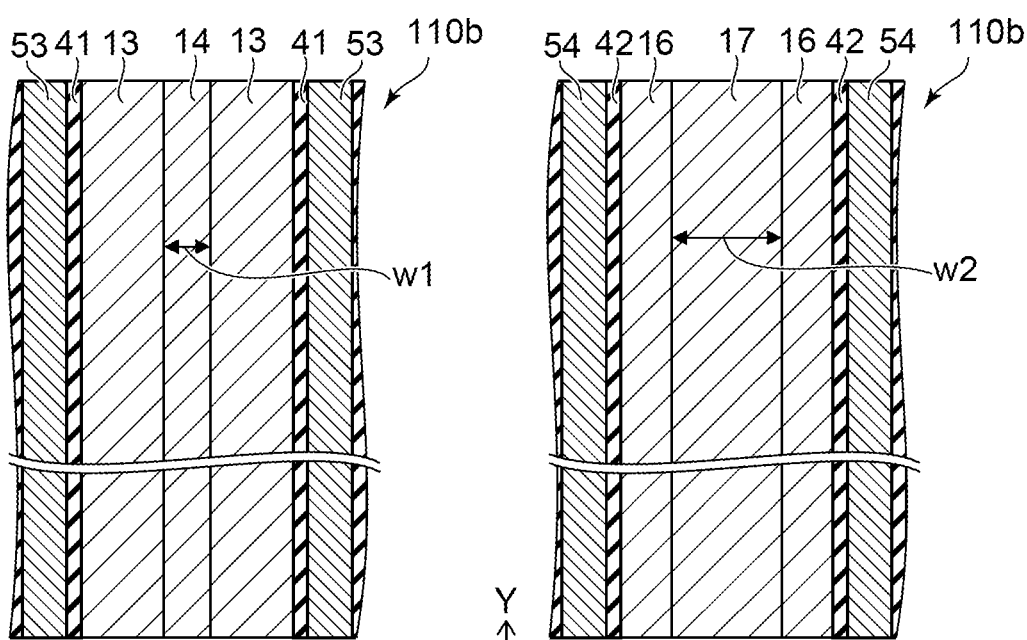

FIGS. 7A to 7C are schematic cross-sectional views illustrating a semiconductor device according to the first embodiment.

FIG. 7B is a line A1-A2 cross-sectional view of FIG. 7A. FIG. 7C is a line A3-A4 cross-sectional view of FIG. 7A.

In the semiconductor device 110b as shown in FIGS. 7B and 7C, the second width w2 along the second direction (the X-axis direction) of the seventh semiconductor region 17 is greater than the first width w1 along the second direction of the fourth semiconductor region 14. According to the embodiment, for example, the second width w2 is not less than 20 times and not more than 2000 times the first width w1. The loss can be effectively reduced thereby.

Figure 8A:
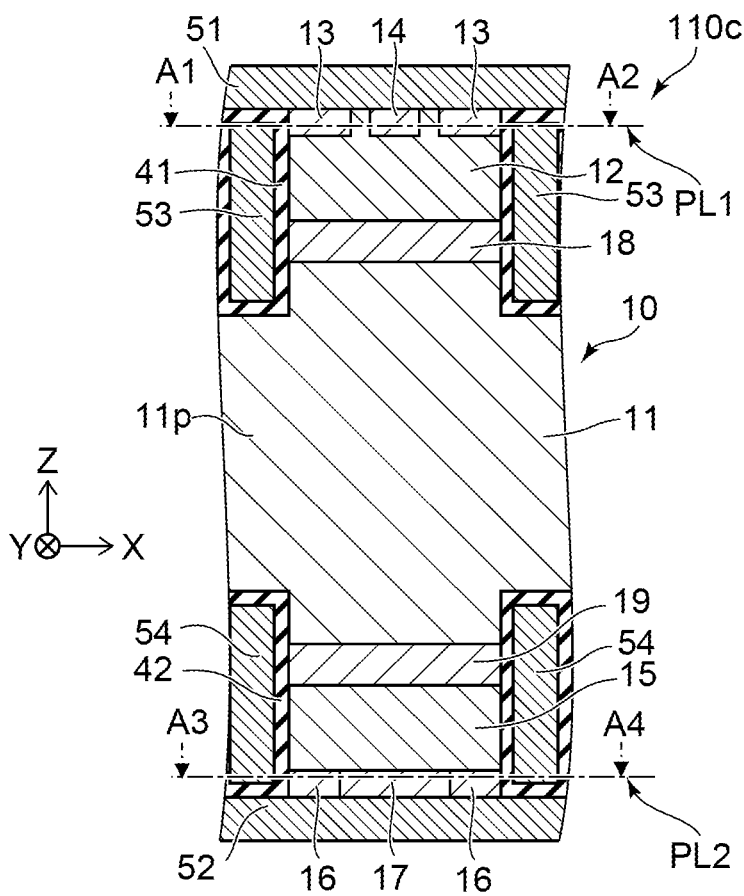
FIGS. 8A to 8C are schematic cross-sectional views illustrating a semiconductor device according to the first embodiment.
Figures 8B, 8C:
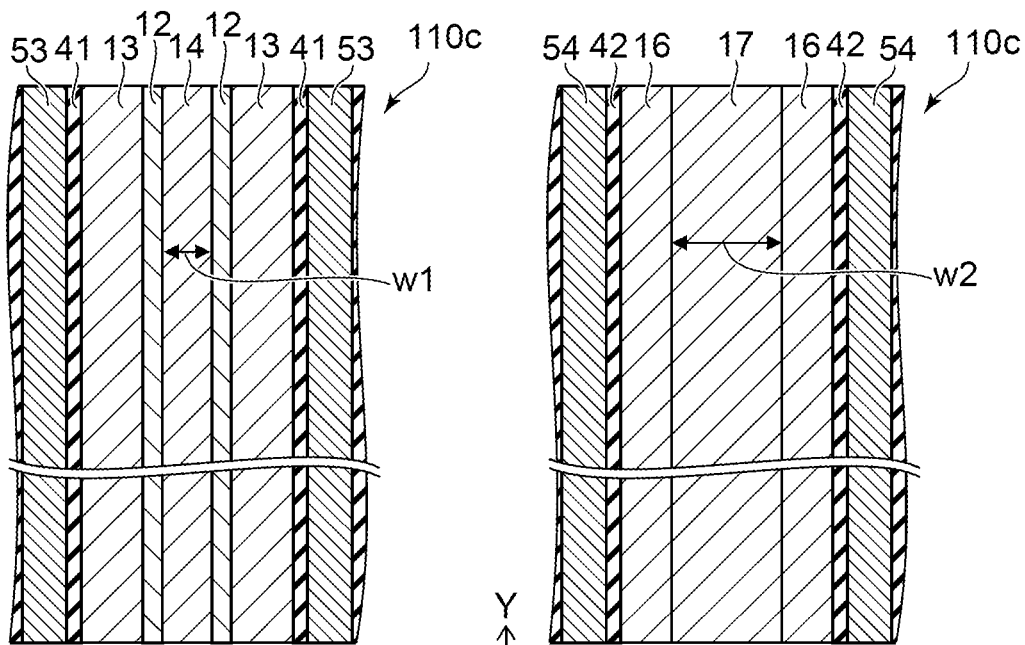

FIGS. 8A to 8C are schematic cross-sectional views illustrating a semiconductor device according to the first embodiment.

FIG. 8B is a line A1-A2 cross-sectional view of FIG. 8A. FIG. 8C is a line A3-A4 cross-sectional view of FIG. 8A.

As shown in FIGS. 8B and 8C, in the semiconductor device 110c as well, the second width w2 of the seventh semiconductor region 17 is greater than the first width w1. In the semiconductor device 110c, a portion of the second semiconductor region 12 is between the third semiconductor region 13 and the fourth semiconductor region 14. In the semiconductor device 110c as well, the loss can be reduced.

Figure 9A:
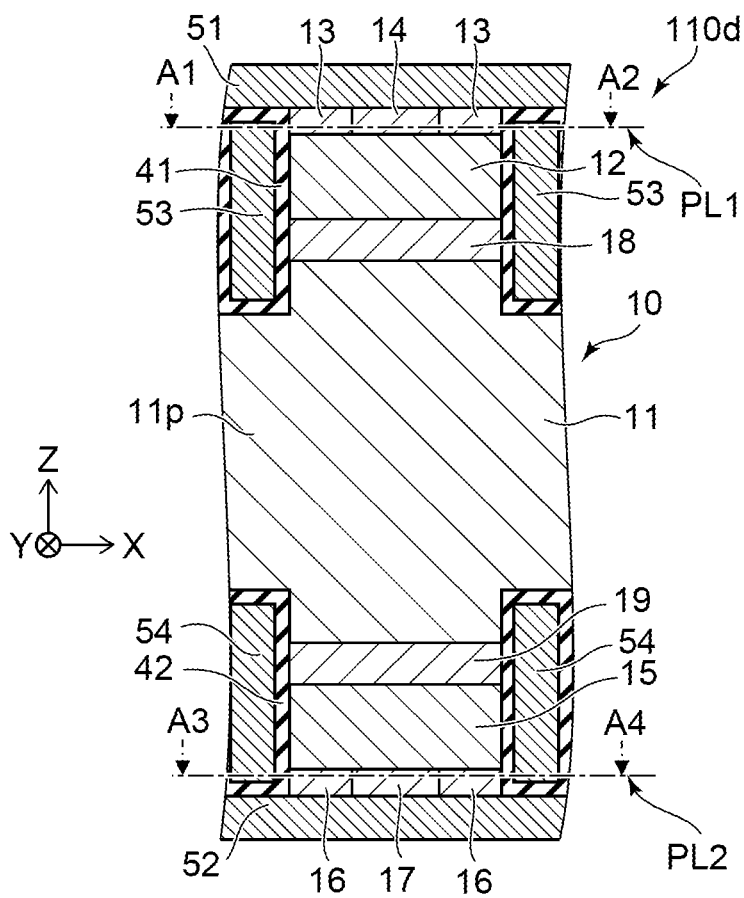
FIGS. 9A to 9C are schematic cross-sectional views illustrating a semiconductor device according to the first embodiment.
Figures 9B, 9C:
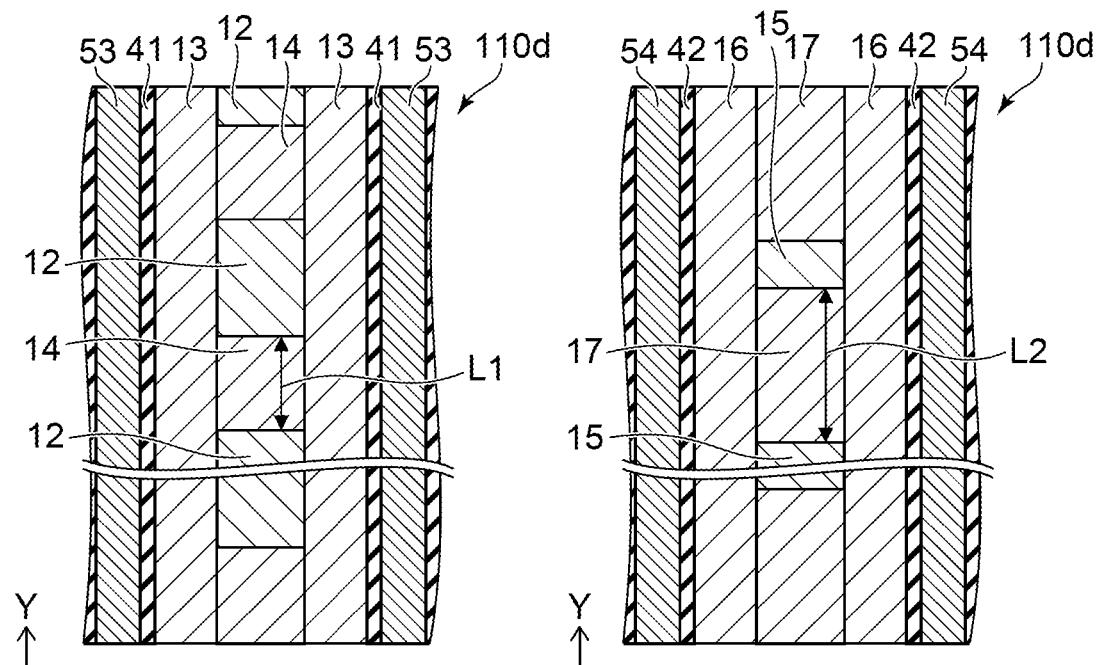

FIGS. 9A to 9C are schematic cross-sectional views illustrating a semiconductor device according to the first embodiment.

FIG. 9B is a line A1-A2 cross-sectional view of FIG. 9A. FIG. 9C is a line A3-A4 cross-sectional view of FIG. 9A.

As shown in FIGS. 9B and 9C, the semiconductor device 110d includes multiple fourth semiconductor regions 14 and multiple seventh semiconductor regions 17. The multiple fourth semiconductor regions 14 and the multiple seventh semiconductor regions 17 each have island shapes. A portion of the second semiconductor region 12 is between one of the multiple fourth semiconductor regions 14 and another one of the multiple fourth semiconductor regions 14. A portion of the fifth semiconductor region 15 is between one of the multiple seventh semiconductor regions 17 and another one of the multiple seventh semiconductor regions 17.

In the semiconductor device 110d, the length in the Y-axis direction is different between the fourth semiconductor region 14 and the seventh semiconductor region 17. For example, a direction that crosses a plane including the first direction (the Z-axis direction) and the second direction (e.g., the X-axis direction) is taken as a fourth direction. The fourth direction is, for example, the Y-axis direction. The second length L2 of the seventh semiconductor region 17 along the fourth direction is greater than the first length L1 of the fourth semiconductor region 14 along the fourth direction. In the semiconductor device 110d as well, the loss can be reduced. According to the embodiment, for example, the second length L2 is 20 times the first length L1. The loss can be effectively reduced thereby. For example, the second length L2 may be not more than 2000 times the first length L1.

FIGS. 10A to 10C are schematic cross-sectional views illustrating a semiconductor device according to the first embodiment.

FIG. 10B is a line A1-A2 cross-sectional view of FIG. 10A. FIG. 10C is a line A3-A4 cross-sectional view of FIG. 10A.

As shown in FIGS. 10B and 10C, the semiconductor device 110e also includes the multiple fourth semiconductor regions 14 and the multiple seventh semiconductor regions 17. In the semiconductor device 110e, the length in the Y-axis direction of the second semiconductor region 12 between the multiple fourth semiconductor regions 14 is greater than the length in the Y-axis direction of the fifth semiconductor region 15 between the multiple seventh semiconductor regions 17. The ratio (the second area ratio) of the surface area of the seventh semiconductor region 17 per unit area in the X-Y plane is greater than the ratio (the first area ratio) of the surface area of the fourth semiconductor region 14 per unit area in the X-Y plane. In the semiconductor device 110e as well, the loss can be reduced.

According to the embodiment, the area ratio can be modified by modifying at least one of the width or the length for the fourth and seventh semiconductor regions 14 and 17. The volume ratio can be modified by modifying the area ratio. The volume ratio can be modified by modifying the thicknesses of the fourth and seventh semiconductor regions 14 and 17.

According to the embodiment, at least one of the impurity concentration, the carrier concentration, or the volume ratio may be modified. For example, the seventh semiconductor region 17 may have at least one of the second impurity concentration of the second conductivity type that is greater than the first impurity concentration, the second carrier concentration of the second conductivity type that is greater than the first carrier concentration, or the second volume ratio that is greater than the first volume ratio.

Figure 11:
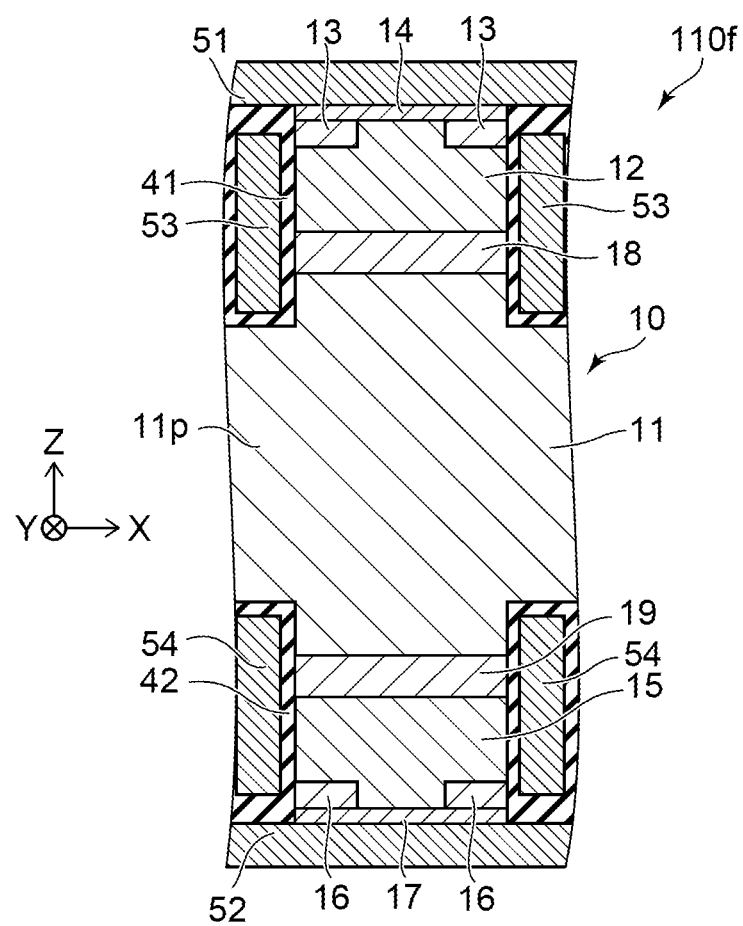
FIG. 11 is a schematic cross-sectional view illustrating a semiconductor device according to the first embodiment.

FIG. 11 is a schematic cross-sectional view illustrating a semiconductor device according to the first embodiment.

In the semiconductor device 110f as shown in FIG. 11, at least a portion of the third semiconductor region 13 is between a portion of the third electrode 53 and a portion of the second semiconductor region 12 in the second direction (e.g., the X-axis direction). At least a portion of the sixth semiconductor region 16 is between a portion of the fourth electrode 54 and a portion of the fifth semiconductor region 15 in the third direction (e.g., the X-axis direction). The third semiconductor region 13 is between the second semiconductor region 12 and the fourth semiconductor region 14 in the Z-axis direction. The sixth semiconductor region 16 is between the fifth semiconductor region 15 and the seventh semiconductor region 17 in the Z-axis direction.

Thus, at least a portion of the third semiconductor region 13 is in at least one of a first position between the fourth semiconductor region 14 and a portion of the third electrode 53 in the second direction (the X-axis direction) or a second position between a portion of the third electrode 53 and a portion of the second semiconductor region 12 in the second direction. At least a portion of the sixth semiconductor region 16 is in at least one of a third position between the seventh semiconductor region 17 and a portion of the fourth electrode 54 in the third direction (the X-axis direction) or a fourth position between a portion of the fourth electrode 54 and a portion of the fifth semiconductor region 15 in the third direction.

Figure 12:
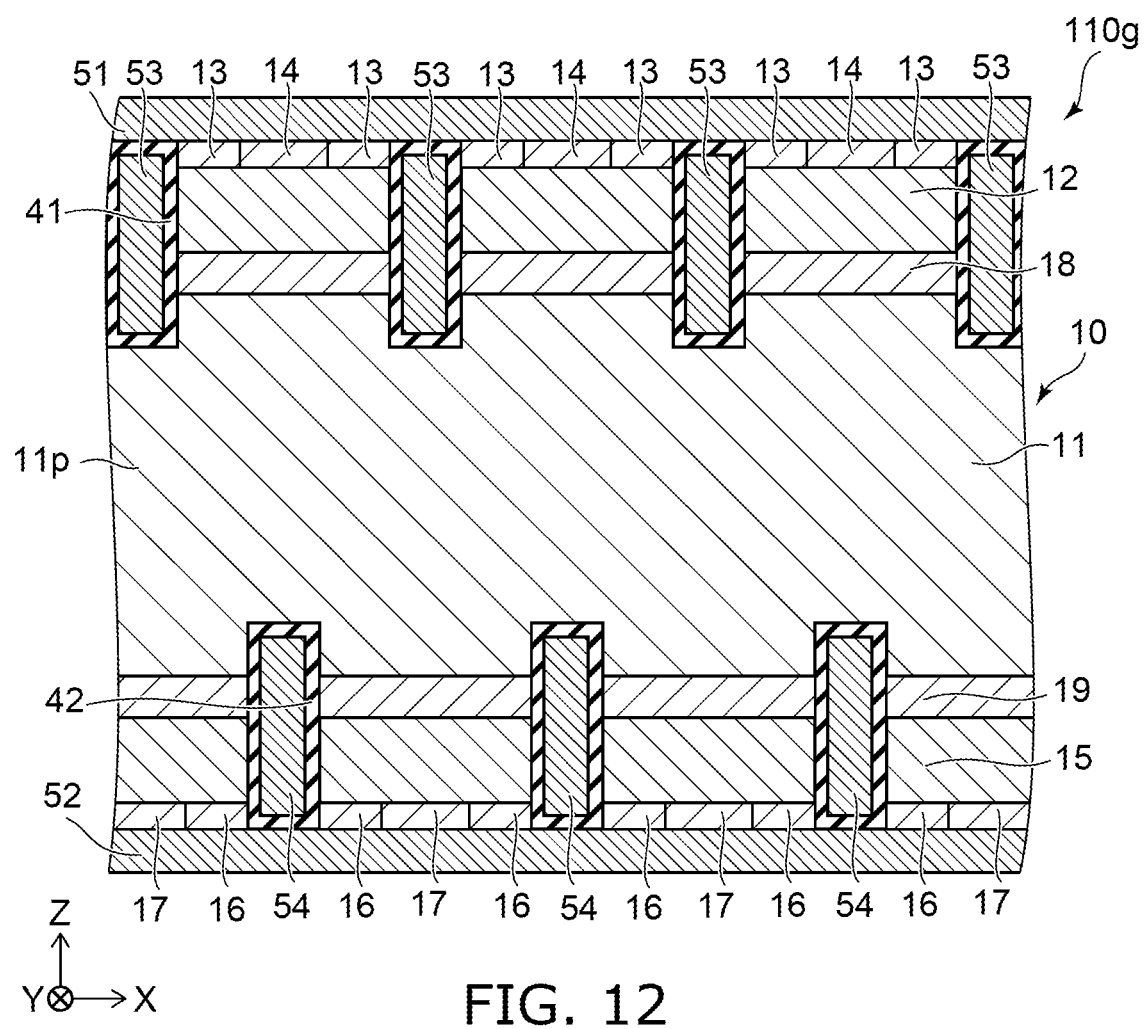
FIG. 12 is a schematic cross-sectional view illustrating a semiconductor device according to the first embodiment.

FIG. 12 is a schematic cross-sectional view illustrating a semiconductor device according to the first embodiment.

In the semiconductor device 110g as shown in FIG. 12, the multiple third electrodes 53 are arranged in the X-axis direction. The multiple fourth electrodes 54 are arranged in the X-axis direction. The position in the X-axis direction of one of the multiple third electrodes 53 is between the position in the X-axis direction of one of the multiple fourth electrodes 54 and the position in the X-axis direction of another one of the multiple fourth electrodes 54. The position in the X-axis direction of one of the multiple fourth electrodes 54 is between the position in the X-axis direction of one of the multiple third electrodes 53 and the position in the X-axis direction of another one of the multiple third electrodes 53.

Figure 13:
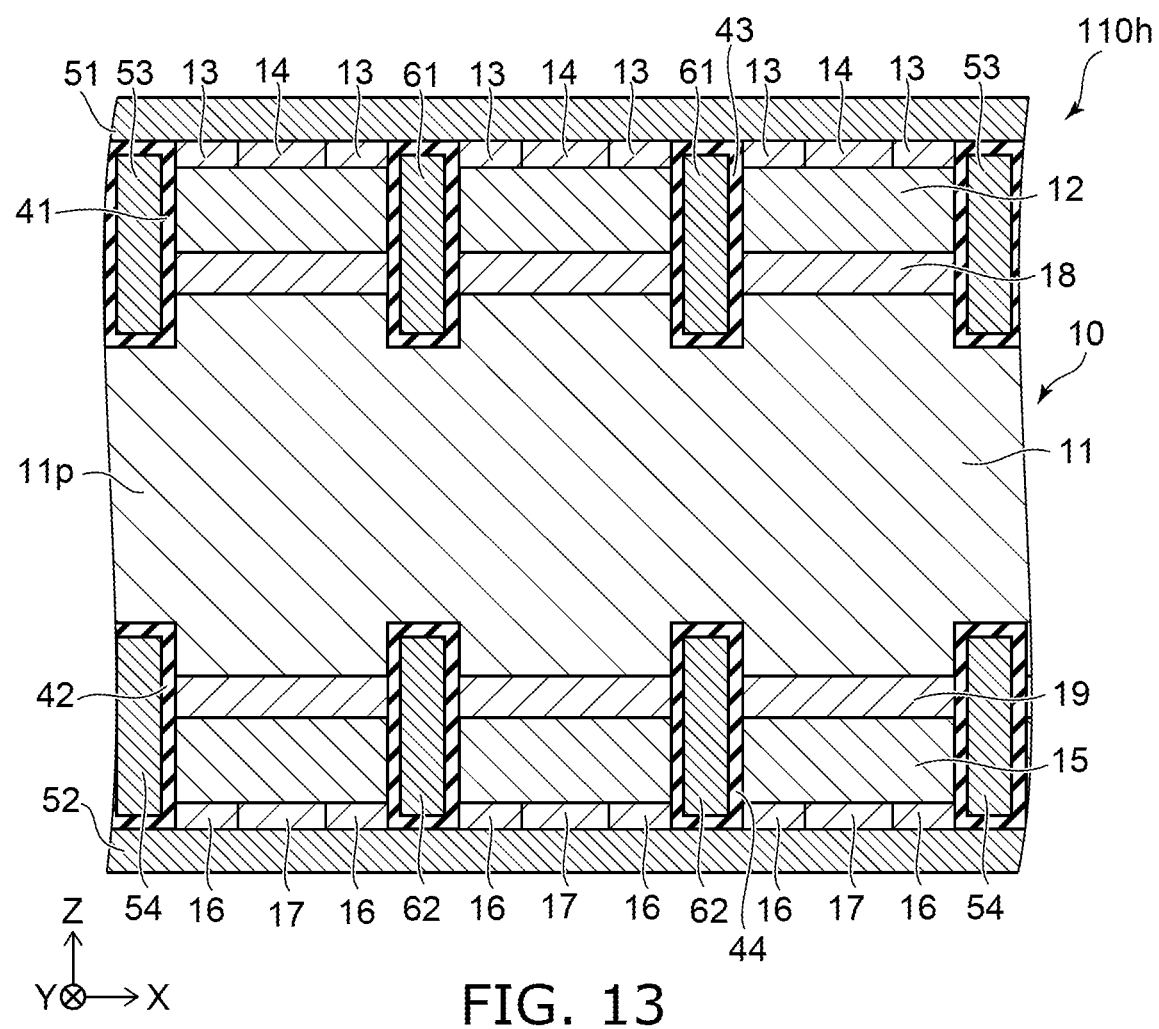
FIG. 13 is a schematic cross-sectional view illustrating a semiconductor device according to the first embodiment.

FIG. 13 is a schematic cross-sectional view illustrating a semiconductor device according to the first embodiment.

As shown in FIG. 13, the semiconductor device 110h further includes a first conductive member 61, a second conductive member 62, a third insulating member 43, and a fourth insulating member 44 in addition to the first electrode 51, the second electrode 52, the third electrode 53, the fourth electrode 54, the first insulating member 41, and the second insulating member 42 described above.

The position in the first direction (the Z-axis direction) of the portion 11p of the first semiconductor region 11 is between the position in the first direction of the second conductive member 62 and the position in the first direction of the first conductive member 61. At least a portion of the third insulating member 43 is between the first conductive member 61 and the semiconductor member 10. At least a portion of the fourth insulating member 44 is between the second conductive member 62 and the semiconductor member 10. The first conductive member 61 is electrically connected with the first electrode 51. As described below, the first conductive member 61 may be electrically connectable with the first electrode 51. The second conductive member 62 is electrically connected with the second electrode 52. As described below, the second conductive member 62 may be electrically connectable with the second electrode 52. For example, the first conductive member 61 and the second conductive member 62 may function as field plates. For example, the concentration of the electric field is suppressed. For example, a high breakdown voltage is obtained.

Figure 14:
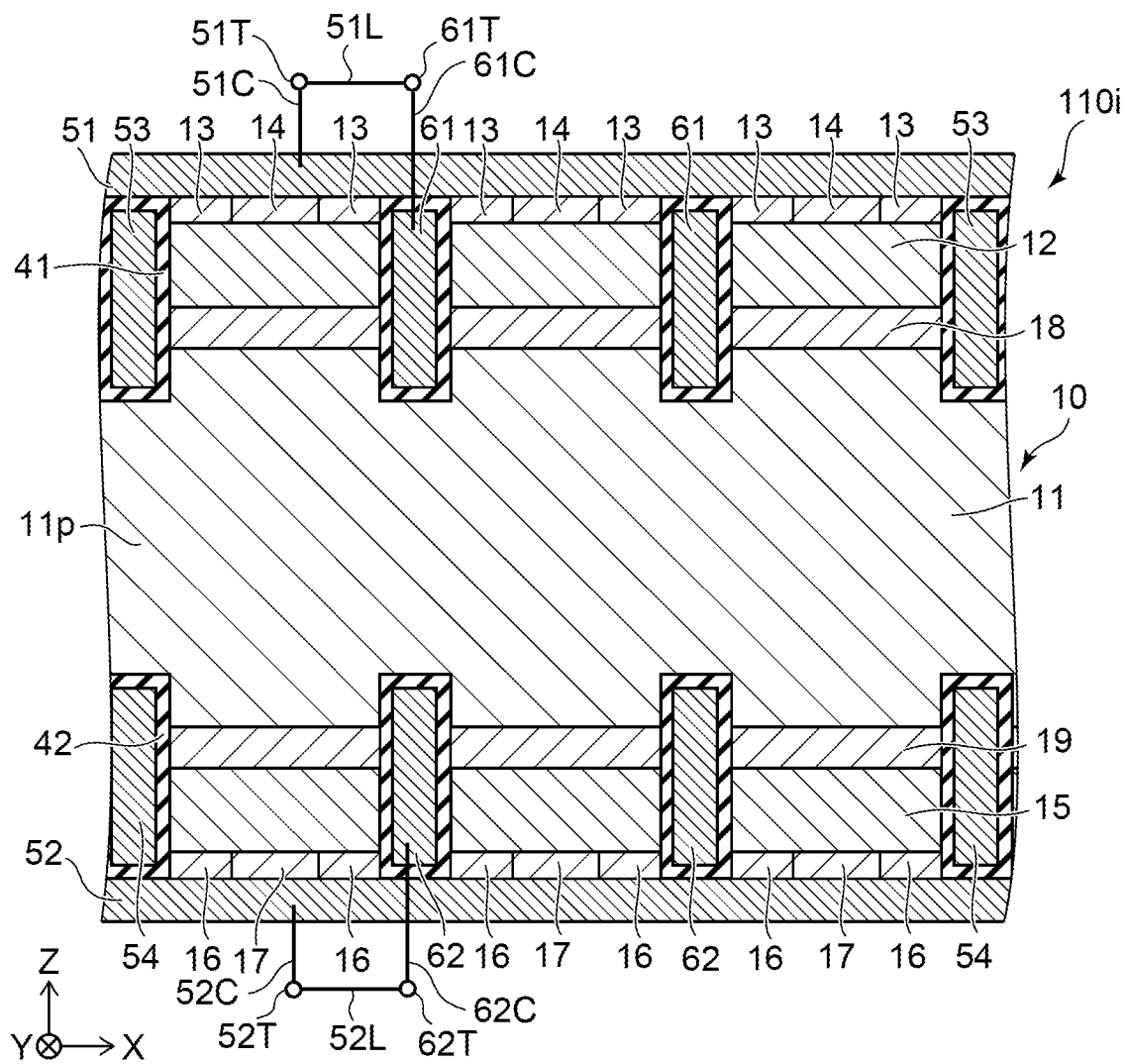
FIG. 14 is a schematic cross-sectional view illustrating a semiconductor device according to the first embodiment.

FIG. 14 is a schematic cross-sectional view illustrating a semiconductor device according to the first embodiment.

As shown in FIG. 14, the semiconductor device 110i also includes the first conductive member 61, the second conductive member 62, the third insulating member 43, and the fourth insulating member 44. In the semiconductor device 110i, the first conductive member 61 is electrically connected with the first electrode 51 via a connection member 61C, a connection member 51C, and a connection member 51L. A terminal 61T that is electrically connected with the first conductive member 61 may be provided. A terminal 51T that is electrically connected with the first electrode 51 may be provided. The terminal 51T and the terminal 61T may be electrically connected by the connection member 51L. The connection member 51L may not be included in the semiconductor device 110i. Thus, the first conductive member 61 may be electrically connectable with the first electrode 51.

The second conductive member 62 is electrically connected with the second electrode 52 via a connection member 62C, a connection member 52C, and a connection member 52L. A terminal 62T that is electrically connected with the second conductive member 62 may be provided. A terminal 52T that is electrically connected with the second electrode 52 may be provided. The terminal 52T and the terminal 62T may be electrically connected by the connection member 52L. The connection member 52L may not be included in the semiconductor device 110i. Thus, the second conductive member 62 may be electrically connectable with the second electrode 52. For example, the concentration of the electric field is suppressed. For example, a high breakdown voltage is obtained.

In the semiconductor devices 110a to 110i, for example, the seventh semiconductor region 17 may have at least one of the second impurity concentration of the second conductivity type that is greater than the first impurity concentration, the second carrier concentration of the second conductivity type that is greater than the first carrier concentration, or the second volume ratio that is greater than the first volume ratio. The loss can be reduced.

Second Embodiment

A second embodiment relates to a semiconductor module.

Figure 15:
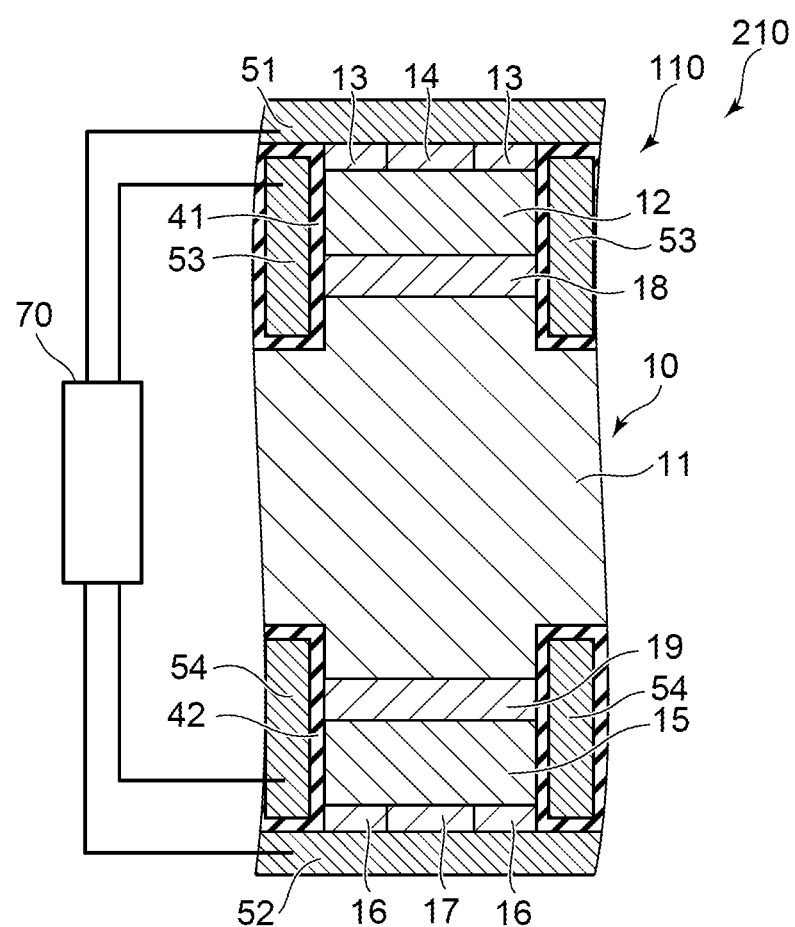
FIG. 15 is a schematic view illustrating a semiconductor module according to a second embodiment.

FIG. 15 is a schematic view illustrating a semiconductor module according to the second embodiment.

As shown in FIG. 15, the semiconductor module 210 according to the second embodiment includes the semiconductor device according to the first embodiment (in the example, the semiconductor device 110) and a controller 70. The controller 70 is electrically connected with the first to fourth electrodes 51 to 54. The controller 70 can control the potential of the third electrode 53 and the potential of the fourth electrode 54. The potential of the third electrode 53 and the potential of the fourth electrode 54 are, for example, potentials that are referenced to the potential of the first electrode 51.

Figure 16A:
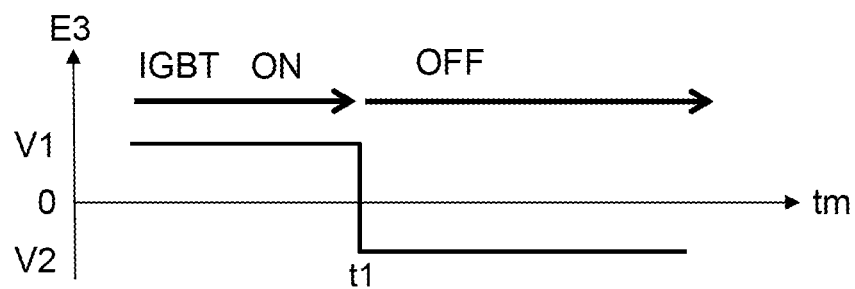
FIGS. 16A and 16B are schematic views illustrating operations of the semiconductor module according to the second embodiment.
Figure 16B:
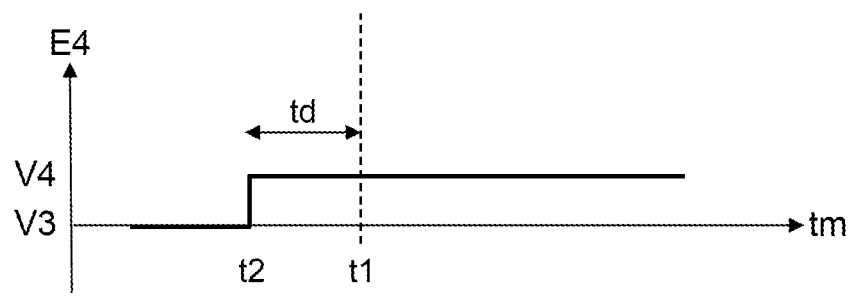

FIGS. 16A and 16B are schematic views illustrating operations of the semiconductor module according to the second embodiment.

In FIGS. 16A and 16B, the horizontal axis is a time tm. The vertical axis of FIG. 16A is a potential E3 of the third electrode 53. The vertical axis of FIG. 16B is a potential E4 of the fourth electrode 54. These potentials are controlled by the controller 70.

As shown in FIG. 16A, the controller 70 is configured to perform the first operation of switching the third electrode 53 from a first potential V1 to a second potential V2 that is less than the first potential V1. The first operation corresponds to the "off-operation" of causing the IGBT operation to transition from the "on-state" to the "off-state". In the first operation, the controller 70 switches the third electrode 53 from the first potential V1 to the second potential V2 at a first time t1. The first potential V1 is, for example, +15 V. The second potential V2 is, for example, −15 V. In such a first operation, the controller 70 switches the fourth electrode 54 from a third potential V3 to a fourth potential V4 that is greater than the third potential V3 at a second time t2 that is before the first time t1. The third potential V3 is, for example, 0 V. The fourth potential V4 is, for example, +15 V. The turn-off switching loss Eoff can be reduced by such an operation.

As shown in FIG. 16B, the time between the first time t1 and the second time t2 is taken as a time difference td. An example of the change of the turn-off switching loss Eoff when changing the time difference td will now be described.

Figure 17:
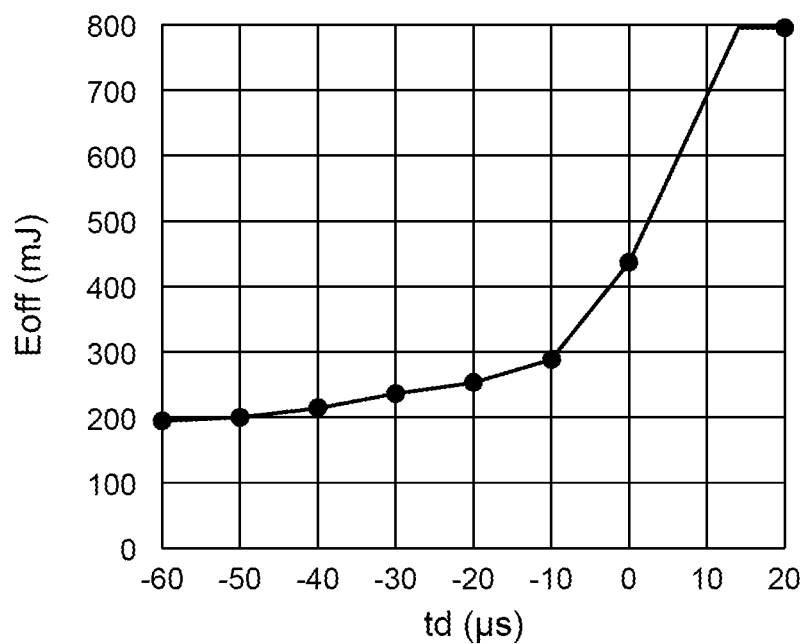
FIG. 17 is a graph illustrating a characteristic of the semiconductor device.

FIG. 17 is a graph illustrating a characteristic of the semiconductor device.

The horizontal axis of FIG. 17 is the time difference td between the time of the change of the potential of the third electrode 53 and the time of the change of the potential of the fourth electrode 54 in the off-state of the IGBT operation. When the time difference td is 0, the potential of the fourth electrode 54 becomes the on-state potential when the potential of the third electrode 53 becomes the off-potential. When the time difference td is positive, the potential of the fourth electrode 54 becomes the on-state potential after the potential of the third electrode 53 becomes the off-potential. When the time difference td is negative, the potential of the fourth electrode 54 becomes the on-state potential before the potential of the third electrode 53 becomes the off-potential. As shown in FIG. 17, the turn-off switching loss Eoff decreases when the time difference td is negative. It is considered that this effect is caused by the carriers that were stored in the on-state being ejected directly before turn-off. The turn-off switching loss Eoff can be reduced by setting the time difference td to be negative and by setting the absolute value of the time difference td to be not less than 1 μs. The turn-off switching loss Eoff can be reduced by setting the time difference td to be negative and by setting the absolute value of the time difference td to be not less than 5 μs. The turn-off switching loss Eoff can be effectively reduced by setting the time difference td to be negative and by setting the absolute value of the time difference td to be not less than 10 μs.

According to the embodiment, it is favorable for the time difference td to be negative, and for the absolute value of the time difference td to be not less than 10 μs. The turn-off switching loss Eoff can be reduced thereby. It is more favorable for the time difference td to be negative and for the absolute value of the time difference td to be not less than 20 ρS. The turn-off switching loss Eoff can be effectively reduced thereby. It is favorable for the time difference td to be negative and for the absolute value of the time difference td to be not more than 200 μs. If the time difference td is excessively long, for example, the conduction loss in the IGBT operation increases. By setting the time difference td to be negative and by setting the absolute value of the time difference td to be not more than 200 the conduction loss in the IGBT operation is easily suppressed.

For example, the fourth electrode 54 is caused to transition to the on-state potential before the time of switching the IGBT operation off by setting the third electrode 53 to the off-potential. In such a case, the effect of the reduction of the turn-off switching loss Eoff is increased because the amount of the second-conductivity-type carriers in the seventh semiconductor region 17 is greater than the amount of the second-conductivity-type carriers in the fourth semiconductor region 14. It is considered that this is caused by more carriers being ejected directly before turn-off.

In embodiments described above, it is favorable for the first-conductivity-type carrier concentration in the first semiconductor region 11 to be not less than $1\times10^{12}/cm^3$ and not more than $1\times10^{14}/cm^3$. It is favorable for the second-conductivity-type carrier concentration in the second semiconductor region 12 to be not less than $1\times10^{16}/cm^3$ and not more than $1\times10^{18}/cm^3$. It is favorable for the first-conductivity-type carrier concentration in the third semiconductor region 13 to be not less than $1\times10^{18}/cm^3$ and not more than $5\times10^{20}/cm^3$. It is favorable for the second-conductivity-type carrier concentration in the fourth semiconductor region 14 to be not less than $1\times10^{18}/cm^3$ and not more than $1\times10^{20}/cm^3$. It is favorable for the second-conductivity-type carrier concentration in the fifth semiconductor region 15 to be not less than $1\times10^{16}/cm^3$ and not more than $1\times10^{18}/cm^3$. It is favorable for the first-conductivity-type carrier concentration in the sixth semiconductor region 16 to be not less than $1\times10^{18}/cm^3$ and not more than $5\times10^{20}/cm^3$. It is favorable for the second-conductivity-type carrier concentration in the seventh semiconductor region 17 to be not less than $1\times10^{18}/cm^3$ and not more than $1\times10^{20}/cm^3$. It is favorable for the first-conductivity-type carrier concentration in the eighth semiconductor region 18 to be not less than $1\times10^{15}/cm^3$ and not more than $1\times10^{17}/cm^3$. It is favorable for the first-conductivity-type carrier concentration in the ninth semiconductor region 19 to be not less than $1\times10^{15}/cm^3$ and not more than $1\times10^{17}/cm^3$.

In embodiments described above, it is favorable for the first-conductivity-type impurity concentration in the first semiconductor region 11 to be not less than $1\times10^{12}/cm^3$ and not more than $1\times10^{14}/cm^3$. It is favorable for the second-conductivity-type impurity concentration in the second semiconductor region 12 to be not less than $1\times10^{16}/cm^3$ and not more than $1\times10^{18}/cm^3$. It is favorable for the first-conductivity-type impurity concentration in the third semiconductor region 13 to be not less than $1\times10^{18}/cm^3$ and not more than $5\times10^{20}/cm^3$. It is favorable for the second-conductivity-type impurity concentration in the fourth semiconductor region 14 to be not less than $1\times10^{18}/cm^3$ and not more than $1\times10^{20}/cm^3$. It is favorable for the second-conductivity-type impurity concentration in the fifth semiconductor region 15 to be not less than $1\times10^{16}/cm^3$ and not more than $1\times10^{18}/cm^3$. It is favorable for the first-conductivity-type impurity concentration in the sixth semiconductor region 16 to be not less than $1\times10^{18}/cm^3$ and not more than $5\times10^{20}/cm^3$. It is favorable for the second-conductivity-type impurity concentration in the seventh semiconductor region 17 to be not less than $1\times10^{18}/cm^3$ and not more than $1\times10^{20}/cm^3$. It is favorable for the first-conductivity-type impurity concentration in the eighth semiconductor region 18 to be not less than $1\times10^{15}/cm^3$ and not more than $1\times10^{17}/cm^3$. It is favorable for the first-conductivity-type impurity concentration in the ninth semiconductor region 19 to be not less than $1\times10^{15}/cm^3$ and not more than $1\times10^{17}/cm^3$.

The semiconductor member includes, for example, silicon. The semiconductor member may include, for example, a compound semiconductor, etc. The first electrode 51 includes, for example, aluminum, etc. The second electrode 52 includes, for example, aluminum, etc. At least one of the third electrode 53, the fourth electrode 54, the first conductive member 61, or the second conductive member 62 includes, for example, conductive silicon. The first to fourth insulating members 41 to 44 include, for example, silicon oxide, silicon nitride, silicon oxynitride, aluminum oxide, etc.

In embodiments, information that relates to the configurations of the semiconductor regions, etc., is obtained by, for example, electron microscopy, etc. Information that relates to the impurity concentrations of the semiconductor regions is obtained by, for example, EDX (Energy Dispersive X-ray Spectroscopy), SIMS (Secondary Ion Mass Spectrometry), etc. Information that relates to the carrier concentrations of the semiconductor regions is obtained by, for example, SCM (Scanning Capacitance Microscopy), etc.

According to embodiments, a semiconductor device and a semiconductor module can be provided in which the loss can be reduced.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor members, semiconductor regions, conductive members, electrodes, insulating members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a first electrode;
   a second electrode, a direction from the second electrode toward the first electrode being along a first direction;
   a semiconductor member located between the second electrode and the first electrode in the first direction, the semiconductor member including
      a first semiconductor region of a first conductivity type,
      a second semiconductor region located between the first semiconductor region and the first electrode, the second semiconductor region being of a second conductivity type,
      a third semiconductor region located between the second semiconductor region and the first electrode, the third semiconductor region being of the first conductivity type,
      a fourth semiconductor region located between the second semiconductor region and the first electrode, the fourth semiconductor region being of the second conductivity type and including
         a first impurity concentration of the second conductivity type,
         a first carrier concentration of the second conductivity type, and
         a first volume ratio of a volume of the fourth semiconductor region to a volume of the semiconductor member,
      a fifth semiconductor region located between the first semiconductor region and the second electrode, the fifth semiconductor region being of the second conductivity type,
      a sixth semiconductor region located between the fifth semiconductor region and the second electrode, the sixth semiconductor region being of the first conductivity type; and
      a seventh semiconductor region located between the fifth semiconductor region and the second electrode, the seventh semiconductor region being of the second conductivity type and including at least one of
         a second impurity concentration that is of the second conductivity type and is greater than the first impurity concentration,
         a second carrier concentration that is of the second conductivity type and is greater than the first carrier concentration, or
         a second volume ratio that is greater than the first volume ratio and is a volume ratio of the seventh semiconductor region to the volume of the semiconductor member;
   a third electrode, a second direction from a portion of the third electrode toward the second semiconductor region crossing the first direction, at least a portion of the third semiconductor region being in at least one of a first position or a second position, the first position being between the fourth semiconductor region and a portion of the third electrode in the second direction, the second position being between the portion of the third electrode and a portion of the second semiconductor region in the second direction;

a fourth electrode, a third direction from a portion of the fourth electrode toward the fifth semiconductor region crossing the first direction, at least a portion of the sixth semiconductor region being in at least one of a third position or a fourth position, the third position being between the seventh semiconductor region and a portion of the fourth electrode in the third direction, the fourth position being between the portion of the fourth electrode and a portion of the fifth semiconductor region in the third direction;

a first insulating member, at least a portion of the first insulating member being between the third electrode and the semiconductor member; and a second insulating member, at least a portion of the second insulating member being between the fourth electrode and the semiconductor member.

2. The device according to claim 1, wherein the second carrier concentration is not less than 20 times the first carrier concentration.

3. The device according to claim 1, wherein the second impurity concentration is not less than 20 times the first impurity concentration.

4. The device according to claim 1, wherein the second volume ratio is not less than 20 times the first volume ratio.

5. The device according to claim 1, wherein a second thickness along the first direction of the seventh semiconductor region is greater than a first thickness in the first direction of the fourth semiconductor region.

6. The device according to claim 1, wherein a second area ratio of the seventh semiconductor region per unit area in a second plane crossing the first direction is greater than a first area ratio of the fourth semiconductor region per unit area in a first plane crossing the first direction.

7. The device according to claim 1, wherein a second width along the second direction of the seventh semiconductor region is greater than a first width along the second direction of the fourth semiconductor region.

8. The device according to claim 1, wherein a second length of the seventh semiconductor region along a fourth direction crossing a plane including the first and second directions is greater than a first length of the fourth semiconductor region along the fourth direction.

9. The device according to claim 1, wherein a first distance along the first direction between the second electrode and the third electrode is less than a second distance along the first direction between the second electrode and the second semiconductor region, and a third distance along the first direction between the first electrode and the fourth electrode is less than a fourth distance along the first direction between the first electrode and the fifth semiconductor region.

10. The device according to claim 1, wherein the first carrier concentration is greater than a carrier concentration of the second conductivity type in the second semiconductor region, and the second carrier concentration is greater than a carrier concentration of the second conductivity type in the fifth semiconductor region.

11. The device according to claim 1, wherein a carrier concentration of the first conductivity type in the third semiconductor region is greater than a carrier concentration of the first conductivity type in the first semiconductor region, and a carrier concentration of the first conductivity type in the sixth semiconductor region is greater than the carrier concentration of the first conductivity type in the first semiconductor region.

12. The device according to claim 1, wherein the semiconductor member further includes:

an eighth semiconductor region located between the first semiconductor region and the second semiconductor region, the eighth semiconductor region being of the first conductivity type; and a ninth semiconductor region located between the first semiconductor region and the fifth semiconductor region, the ninth semiconductor region being of the first conductivity type, an impurity concentration of the first conductivity type in the eighth semiconductor region is greater than an impurity concentration of the first conductivity type in the first semiconductor region, and an impurity concentration of the first conductivity type in the ninth semiconductor region is greater than the impurity concentration of the first conductivity type in the first semiconductor region.

13. The device according to claim 1, wherein the third semiconductor region and the fourth semiconductor region are electrically connected with the first electrode, and the sixth semiconductor region and the seventh semiconductor region are electrically connected with the second electrode.

14. The device according to claim 1, wherein a portion of the first semiconductor region is between the fourth electrode and the third electrode in the first direction.

15. The device according to claim 1, wherein a direction from the third semiconductor region toward the fourth semiconductor region crosses the first direction, and a direction from the sixth semiconductor region toward the seventh semiconductor region crosses the first direction.

16. The device according to claim 1, wherein at least a portion of the third semiconductor region is between the fourth semiconductor region and a portion of the third electrode.

17. The device according to claim 1, wherein at least a portion of the sixth semiconductor region is between the seventh semiconductor region and a portion of the fourth electrode.

18. The device according to claim 1, further comprising:
a first conductive member;
a second conductive member;
a third insulating member; and
a fourth insulating member, the position in the first direction of the portion of the first semiconductor region being between a position in the first direction of the second conductive member and a position in the first direction of the first conductive member, at least a portion of the third insulating member being between the first conductive member and the semiconductor member, at least a portion of the fourth insulating member being between the second conductive member and the semiconductor member, the first conductive member being electrically connected with the first electrode or electrically connectable with the first electrode, the second conductive member being electrically connected with the second electrode or electrically connectable with the second electrode.

19. A semiconductor module, comprising:

the semiconductor device according to claim 1; and a controller electrically connected with the third and fourth electrodes, in a first operation of switching the third electrode from a first potential to a second potential, the controller switching the fourth electrode from a third potential to a fourth potential at a second time before a first time of switching the third electrode from the first potential to the second potential, the second potential being less than the first potential, the fourth potential being greater than the third potential.

20. The module according to claim 19, wherein a time between the first time and the second time is not less than 1 μs and not more than 200 μs.

* * * * *